(12) United States Patent
Seddon et al.

(10) Patent No.: US 12,132,008 B2
(45) Date of Patent: Oct. 29, 2024

(54) MULTIDIE SUPPORTS AND RELATED METHODS

(71) Applicant: SEMICONDUCTOR COMPONENTS INDUSTRIES, LLC, Phoenix, AZ (US)

(72) Inventors: Michael J. Seddon, Gilbert, AZ (US); Francis J. Carney, Mesa, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 286 days.

(21) Appl. No.: 17/813,357

(22) Filed: Jul. 19, 2022

(65) Prior Publication Data
US 2022/0352095 A1 Nov. 3, 2022

Related U.S. Application Data

(63) Continuation of application No. 16/862,120, filed on Apr. 29, 2020, now Pat. No. 11,430,746.

(51) Int. Cl.
*H01L 23/00* (2006.01)
*H01L 23/31* (2006.01)
*H01L 23/32* (2006.01)
*H01L 25/065* (2023.01)

(52) U.S. Cl.
CPC ............ *H01L 23/562* (2013.01); *H01L 23/31* (2013.01); *H01L 23/32* (2013.01); *H01L 25/0655* (2013.01)

(58) Field of Classification Search
CPC ..................................................... H01L 23/562

USPC ......................................................... 257/787
See application file for complete search history.

(56) References Cited

U.S. PATENT DOCUMENTS

| | | |
|---|---|---|
| 2007/0087544 A1 | 4/2007 | Chang et al. |
| 2008/0224291 A1 | 9/2008 | Schwab et al. |
| 2008/0227240 A1 | 9/2008 | Sharma et al. |
| 2011/0175242 A1 | 7/2011 | Grivna et al. |
| 2012/0104580 A1 | 5/2012 | Feng et al. |
| 2014/0183761 A1 | 7/2014 | Lin et al. |
| 2016/0086838 A1* | 3/2016 | Santos Rodriguez ...................... H01L 21/6835 29/428 |
| 2016/0225733 A1 | 8/2016 | Wilcoxen |
| 2016/0254415 A1 | 9/2016 | Kaempf et al. |
| 2017/0047294 A1 | 2/2017 | Chang et al. |
| 2017/0236765 A1 | 8/2017 | Tamagawa et al. |

(Continued)

FOREIGN PATENT DOCUMENTS

| | | |
|---|---|---|
| CN | 101552248 A | 10/2009 |
| KR | 20210091898 A | 7/2021 |

*Primary Examiner* — Ajay Arora
(74) *Attorney, Agent, or Firm* — Adam R. Stephenson, LTD.

(57) ABSTRACT

Implementations of a semiconductor device may include a first largest planar surface, a second largest planar surface and a thickness between the first largest planar surface and the second largest planar surface; and one of a permanent die support structure, a temporary die support structure, or any combination thereof coupled to one of the first largest planar surface, the second largest planar surface, the thickness, or any combination thereof. The first largest planar surface, the second largest planar surface, and the thickness may be formed by at least two semiconductor die. The warpage of one of the first largest planar surface or the second largest planar surface may be less than 200 microns.

20 Claims, 3 Drawing Sheets

(56) References Cited

U.S. PATENT DOCUMENTS

2018/0166396 A1    6/2018  Lee et al.
2019/0363057 A1*  11/2019  Santos Rodriguez .. H01L 23/16

* cited by examiner

MULTIDIE SUPPORTS AND RELATED METHODS

CROSS REFERENCE TO RELATED APPLICATIONS

This application is a continuation application of the earlier U.S. Utility Patent Application to Seddon entitled "Multidie Supports for Reducing Warpage," application Ser. No. 16/862,120, filed Apr. 29, 2020, the disclosure of which is hereby incorporated entirely herein by reference.

BACKGROUND

1. Technical Field

Aspects of this document relate generally to semiconductor packages, such as wafer scale or chip scale packages. More specific implementations involve packages including an encapsulating or mold compound.

2. Background

Semiconductor packages work to facilitate electrical and physical connections to an electrical die or electrical component in the package. A protective cover or molding has generally covered portions of the semiconductor packages to protect the electrical die or electrical component from, among other things, the environment, electrostatic discharge, and electrical surges.

SUMMARY

Implementations of a semiconductor device may include a first largest planar surface, a second largest planar surface and a thickness between the first largest planar surface and the second largest planar surface; and one of a permanent die support structure, a temporary die support structure, or any combination thereof coupled to one of the first largest planar surface, the second largest planar surface, the thickness, or any combination thereof. The first largest planar surface, the second largest planar surface, and the thickness may be formed by at least two semiconductor die. The warpage of one of the first largest planar surface or the second largest planar surface may be less than 200 microns.

Implementations of semiconductor devices may include one, all, or any of the following:

The thickness may be between 0.1 microns and 125 microns.

The perimeter of at least two semiconductor die rectangular and a size of the at least two semiconductor die may be at least 6 mm by 6 mm.

The perimeter of the at least two semiconductor die may be rectangular and a size of the at least two semiconductor die may be 211 mm by 211 mm or smaller.

The permanent die support structure may include a mold compound.

The perimeter of the at least two semiconductor die may include a closed shape.

The one of the permanent die support structure, the temporary die support structure, or any combination thereof may include a perimeter including a closed shape.

The device may include a second permanent die support structure, a second temporary die support structure, or any combination thereof coupled to one of the first largest planar surface, the second largest planar surface, the thickness, or any combination thereof.

The permanent die support structure, the temporary die support structure, or any combination thereof may include two or more layers.

Implementations of a die support structure may include a material configured to be one of permanently coupled or temporarily coupled with a first largest planar surface, a second largest planar surface and a thickness between the first largest planar surface and the second largest planar surface where the material may be configured to be coupled to one of the first largest planar surface, the second largest planar surface, the thickness, or any combination thereof where the first largest planar surface, the second largest planar surface, and the thickness may be formed by at least two semiconductor die. The thickness may be between 0.1 microns and 125 microns.

Implementations of die support structures may include one, all, or any of the following:

The material may be configured to reduce a warpage of one of the first largest planar surface or the second largest planar surface to less than 200 microns.

The material may be a mold compound.

The material may be configured to be removable by one of exposure to light, ultrasonic energy, peeling, etching, grinding, or any combination thereof.

The material may include a perimeter including a closed shape.

The material may be a first portion of material and may include a second portion of material configured to be coupled to one of the first largest planar surface, the second largest planar surface, the thickness, or any combination thereof.

Implementations of a method of forming a die support structure may include one of permanently coupling or temporarily coupling a material with a first largest planar surface, a second largest planar surface, a thickness between the first largest planar surface and the second largest planar surface, or any combination thereof. The first largest planar surface, a second largest planar surface, and the thickness may be formed by at least two or more semiconductor die. Implementations may include reducing a warpage of one of the first largest planar surface or the second largest planar surface to less than 200 microns through the material.

Implementations of methods of forming a die support may include one, all, or any of the following:

The method may include removing the material using one of light, etching, peeling, ultrasonic energy, grinding, or any combination thereof.

The method may include removing the material after bonding the at least two or more die to one of a substrate, a leadframe, an additional die, a lead, a redistribution layer, and any combination thereof.

The material may be a first portion of material and may include: one of permanently coupling or temporarily coupling a second portion of material with one of the first largest planar surface, the second largest planar surface, the thickness, or any combination thereof.

The second portion of material may be a second layer of material coupled over the first portion of material.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended die support structures will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such die support structures, and implementing components and methods, consistent with the intended operation and methods.

Figure 1:
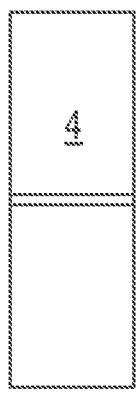
FIG. 1 is a top view of two semiconductor die joined through a die street/scribe line/saw street.

Referring to FIG. 1, an implementation of two thinned semiconductor die 2 is illustrated. Various implementations of groups of thinned semiconductor die disclosed in this document may be formed from a wide variety of semiconductor substrate types, including, by non-limiting example, silicon, polysilicon, silicon-on-insulator, glass, sapphire, ruby, gallium arsenide, silicon carbide, and any other semiconductor material type. Also, various implementations of groups of thinned semiconductor die may include die of any of a wide variety of shapes, including, by non-limiting example, rectangular, elliptical, triangular, polygonal, or any other closed shape. The various implementations of groups of thinned semiconductor die disclosed herein may include any of a wide variety of electronic devices, including, by non-limiting example, integrated bipolar junction transistors (IGBTs), metal oxide semiconductor field effect transistors (MOSFETs), diodes, power semiconductor devices, any semiconductor device disclosed in this document, any combination thereof, or any other active or passive semiconductor device or component, alone or in combination. As illustrated with reference to FIGS. 1 and 2, the two semiconductor die 2 collectively form a first largest planar surface 4 and a second largest planar surface 6 with thickness 8 between them. Because the shape formed by the two semiconductor die 2 is a rectangle, four additional sides 10, 12, 14, and 16 extend across the thickness 8.

In various implementations disclosed herein, the thickness 8 of the groups of thinned semiconductor die may be between about 0.1 microns and about 125 microns. In other implementations, the thickness may be between about 0.1 microns and about 100 microns. In other implementations, the thickness may be between about 0.1 microns and about 75 microns. In other implementations, the thickness may be between about 0.1 microns and about 50 microns. In other implementations, the thickness may be between about 0.1 microns and about 25 microns. In other implementations, the thickness may be between about 0.1 microns and about 10 microns. In other implementations, thickness may be between 0.1 microns and about 5 microns. In other implementations, the thickness may be less than 5 microns.

The groups of various semiconductor die disclosed herein may form groups of various sizes (die sizes). Die size generally refers to measured principal dimensions of the perimeter of the shape formed by a particular group of semiconductor die. For example, for a group of two rectangular die that collectively have a perimeter shaped like a square, the die size can be represented by referring to a height and width of the perimeter. In various implementations, the die size of the group of semiconductor die may be at least about 4 mm by about 4 mm where the perimeter of the group of die is rectangular. In other implementations, the die size may be smaller. In other implementations, the die size of the group of semiconductor die may be about 211 mm by about 211 mm or smaller. For a group of die with a perimeter that is not rectangular, the surface area of the largest planar surface of the group of die may be used as a representation of the die size.

One of the effects of thinning the groups of semiconductor die is that as the thickness decreases, the largest planar surfaces of the groups of semiconductor die may tend to warp or bend in one or more directions as the thinned material of the die permits movement of the material under various forces. Similar warping or bending effects may be observed where the die size becomes much larger than the thickness of the die for large groups of die above about 6 mm by about 6 mm or 36 mm² in surface area. These forces include tensile forces applied by stressed films, stress created through backgrinding, forces applied by backmetal formed onto a largest planar surface of the die, and/or forces induced by the structure of the one or more devices formed on and/or in the semiconductor die. This warping or bending of the thinned groups of semiconductor die can prevent successful processing of the die through the remaining operations needed to form a semiconductor package around the die to allow it to ultimately function as, by non-limiting example, a desired electronic component, processor, module, power semiconductor device, switch, or other active or passive electrical component. Being able to reduce the warpage below a desired threshold amount may permit the groups of die to be successfully processed through the various operations, including, by non-limiting example, die bonding, die attach, package encapsulating, clip attach, lid attach, wire bonding, epoxy dispensing, pin attach, pin insertion, or any other process involved in forming a semiconductor package. In various implementations the warpage of the group of die may need to be reduced to less than about 50 microns measured across a largest planar surface of the die between a highest and lowest point on the largest planar surface. In other implementations, by non-limiting example, where an assembly process involves Au—Si eutectic die attach, the warpage of the group of die may need to be reduced to less than about 25 microns when measured across a largest planar surface of the group of die. In other implementations, by non-limiting example, where a die attach process utilizing solder paste is used, the warpage of the group of die may need to be reduced to about 75 microns or less. In various implementations, the warpage of the group of die may be reduced to below about 200 microns or less. In implementations where larger die are used, more warpage may be tolerated successfully in subsequent packaging operations, so while values less than 25 microns may be desirable for many groups of die, depending on die size, more warpage than about 25, than about 50, than about 75 microns, or up to about 200 microns may be capable of being tolerated.

In various implementations, the warpage may be measured using various techniques. For example, a capacitative scanning system with two probes that utilize changes in the capacitance for each probe when a group of die or wafer is inserted into the gap between the probes to determine a wafer thickness and/or position can be utilized to map the warpage of a die or wafer. An example of such a capacitive system that may be utilized in various implementations may be the system marketed under the tradename PROFORMA 300ISA by MTI Instruments Inc. of Albany, New York. In other implementations, the warpage may be measured by a laser profilometer utilizing confocal sensors marketed under the tradename ACUITY by Schmitt Industries, Inc. of Portland, Oregon. In other implementations, any of the following shape/profile measurement systems marketed by Keyence Corporation of America of Itasca, Illinois could be employed to measure die or wafer warpage: the reflective confocal displacement sensor system marketed under the tradename CL-3000, the 2D laser profiling system marketed under the tradename LJ-V7000, or the 3D interferometric sensing system marketed under the tradename WI-5000.

Figure 2:
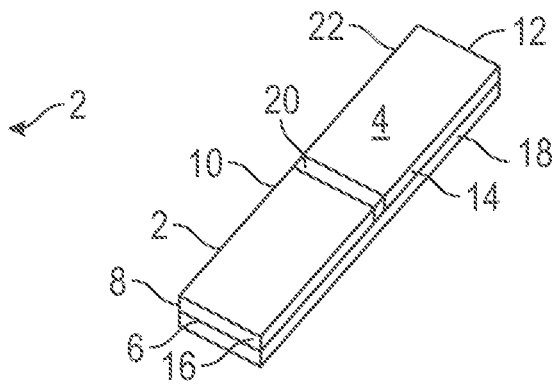
FIG. 2 is a perspective view of the two semiconductor die of FIG. 1 coupled with an implementation of a permanent die support structure coupled with a lower largest planar surface.

Referring to FIG. 2, the two semiconductor die are illustrated coupled together through die street 20. In such an implementation, the two semiconductor are formed through singulating all of the die streets around the two die except for the one that couples the two die together. As illustrated in FIG. 2, an implementation of a permanent die support structure (permanent die support, die support) 18 is illustrated coupled to the two semiconductor die 2. In this implementation, the die support 18 is coupled to and coextensive with a perimeter 22 of a largest planar surface 4 of the two semiconductor die 2. However, and as described in this document, the shape of the perimeter 22 may be a wide variety of shapes, including, by non-limiting example, rectangular, triangular, polygonal, elliptical, circular, or any other closed shape. The permanent die support structure 18 works to support the two semiconductor die during die packaging operations. Furthermore, the permanent die support structure 18 may include two or more portions, which will be described in this document.

In various implementations disclosed in this document, where two or more semiconductor die are packaged together which are intended to be electrically isolated from each other, one or more isolation trenches may be formed between the two more semiconductor die. These isolation trenches may take various forms in different implementations. By non-limiting example, an isolation trench may be formed by etching or ablating a trench structure into the material of the die street between the two more semiconductor die and then filling the trench with an electrically insulating material, such as, by non-limiting example, an oxide, an organic material, a mold compound, any combination thereof, or any other electrically insulating material. In another non-limiting example, the isolation trench may be formed by etching or ablating a series of holes (vias) into the material of the die street between the two or more semiconductor die and then filling the vias with an electrically insulating material like any disclosed herein. A wide variety of isolation trench structures may be formed using the principles disclosed herein to ensure electrical isolation between semiconductor die that are packaged together while joined by a die street region.

Figure 3:
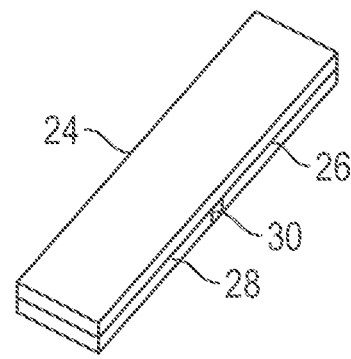
FIG. 3 is a perspective view of the two semiconductor die of FIG. 1 coupled with an implementation of a temporary die support structure coupled with an upper largest planar surface.

While in the implementation illustrated in FIG. 2 the die support structure 18 is a permanent die support structure, in other implementations of die support structures disclosed in this document, the die supports structures may be temporary. Referring to FIG. 3, an implementation of a temporary die support structure 24 coupled to an upper planar surface 26 of a group 28 of two semiconductor die is illustrated. Like the die of FIG. 1 and FIG. 2, the two semiconductor die are coupled together through die street 30. The temporary die support structure 24 is designed to be removably/releaseably coupled to the group of die 28 and reduce the warpage of the group of die during die packaging operations.

In the implementations illustrated in FIGS. 2 and 3, the permanent die support structure 18 and the temporary die support structure 24 each include a material that is applied to the first largest planar surface of their respective group of thinned semiconductor die. The material reduces the warpage of the group of thinned semiconductor die in any of a wide variety of ways, such as, by non-limiting example, having a predetermined hardness value, having a predetermined stiffness value, having a predetermined Shore value, having a predetermined glass transition temperature, having a predetermined cure strength, having a predetermined thickness, having a predetermined film stress, curing at a particular temperature, curing with a particular temperature ramp profile, curing using specific light wavelengths, including one or more fillers, including one or more resins, or any other compound formation process parameter, mold compound ingredient, film parameter capable of affecting the warpage of the thinned semiconductor die. While a single layer of material is illustrated as being used as the permanent die support in FIG. 2 or the temporary die support in FIG. 3, in other implementations two or more layers of material may be employed to form the die support which contain either the same or different material compositions. These two or more layers may be applied simultaneously or sequentially in various implementations.

A wide variety of forms of materials may be employed in various implementations of temporary die supports, including, by non-limiting example, a coating (which may be applied, by non-limiting example, through painting, sputtering, evaporating, electroplating, electroless plating, or spraying or any other method of coating), a tape, a film, a printed structure, a screen printed structure, a stencil printed structure, an adhesive bonded structure, or any other material form capable of being removably or releaseably coupled with the surface of a semiconductor die. A wide variety of material types may be employed in various implementations of temporary die supports, including, by non-limiting example, polyimides, polybenzoxazoles, polyethylenes, metals, benzocyclobutenes (BCBs), photopolymers, adhesives, and any other material or combination of materials capable of being removably or releaseably coupled with a semiconductor die.

In various implementations, the material of the permanent die supports disclosed in this document may be mold compounds. In various implementations, the mold compound is not a polyimide material or other material generally specifically used to act as a passivating material for a semiconductor die surface. The mold compound may include any of a wide variety of compounds, including, by non-limiting example, encapsulants, epoxies, resins, polymers, polymer blends, fillers, particles, thermally conductive particles, electrically conductive particles, pigments, and any other material capable of assisting in forming a stable permanent supporting structure. In some implementations the mold compound may be non-electrically conductive (insulative). In other implementations, the mold compound may be electrically conductive, such as an anisotropic conductive film. In such implementations where the mold compound is electrically conductive, the mold compound is not a metal, but rather is formed as a matrix containing electrically conductive materials, such as, by non-limiting example, metal particles, graphene particles, graphite particles, metal fibers, graphene fibers, carbon fibers, carbon fiber particles, or any other electrically conductive particle or fiber. In various implementations, the mold compound may be a material which has a flexural strength of between about 13 N/mm$^2$ to 185 N/mm$^2$. Flexural strength is the ability of the mold compound to resist plastic deformation under load. Plastic deformation occurs when the mold compound no longer will return to its original dimensions after experiencing the load. For those implementations of permanent die support structures, flexural strength values of the mold compound to be used may generally be selected so that the chosen mold compound has sufficient flexural strength at the maximum expected operating temperature to avoid plastic deformation.

A wide variety of shapes and structures may be employed as permanent or temporary die support structures in various implementations that may employ any of the material types, material forms, material parameters, or film parameters disclosed in this document to reduce the warpage of a group of thinned die to any of the desired levels disclosed in this document.

Figure 4:
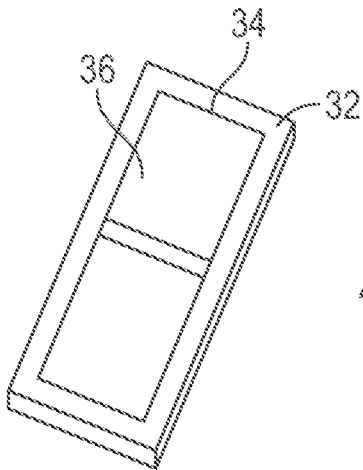
FIG. 4 is a perspective view of the two semiconductor die of FIG. 1 coupled with an implementation of a die support structure coupled at a thickness.

Referring to FIG. 4, an implementation of a permanent die support structure 32 that is coupled at the thickness 34 of a group of semiconductor die 36. In this implementation, the permanent die support structure 32 extends continuously around the thickness/perimeter 34 of the group of die 36. In this implementation, having the permanent die support structure 32 around the thickness 34 of the die 36 may reduce the warpage of the die 36 to a desired level like any disclosed in this document.

Figure 5:
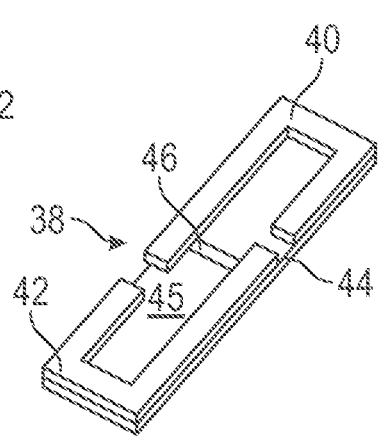
FIG. 5 is a perspective view of an implementation of a die support structure that includes a first portion and a second portion coupled to a largest planar surface of two semiconductor die.

Referring to FIG. 5, an implementation of a permanent die support structure 38 is illustrated that includes two C-shaped or U-shaped portions, a first portion 40 and a second portion 42. The first portion 40 and second portion 42 are separated by a gap along each side of the group of semiconductor die 44 which are coupled through die street 46. The material of the die support structure 38 in this implementation is included in the first portion 40 and second portion 42 and may be any material disclosed for use in a permanent die support structure disclosed in this document. In other implementations, the two C-shaped or U-shaped portions may alternatively be coupled across or over the thickness the group of semiconductor die. In other implementations, the U- or C-shaped first portion and second portion may be coupled to the lower largest planar surface of the group of semiconductor die rather than the upper largest planar surface. The same two U- or C-shaped structures may also be employed as a temporary die support for a group of thinned semiconductor die in the same various coupling locations previously described in various implementations.

Figure 6:
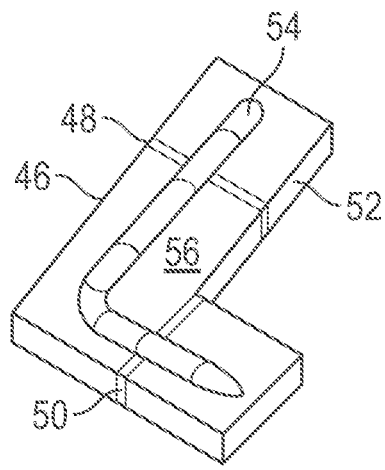
FIG. 6 is a perspective view of an implementation of a die support structure that is coupled along a largest planar surface of three semiconductor die.

Referring to FIG. 6, a group of three semiconductor die 46 is illustrated coupled through die streets 48, 50 where at least one of the die has a different individual die and the group has a non-rectangular shape to its perimeter 52. An implementation of a temporary die support 54 is coupled to the upper largest planar surface 56 of the group of die 46. In this implementation, the temporary die support 54 is used to maintain the warpage of the group of die 46 below a desired value until the group of die are attached to a substrate and the need for the temporary die support 54 is no longer needed and it is removed.

Figure 7:
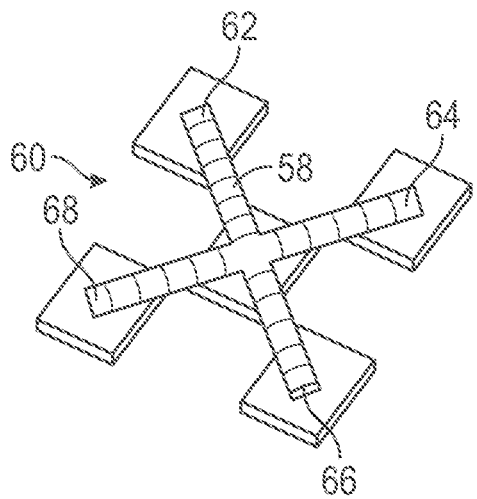
FIG. 7 is a perspective view of an implementation of an X-shaped die support structure coupled to five semiconductor die.

Referring to FIG. 7, an implementation of a permanent die support structure 58 is illustrated. In this implementation, the structure 58 is formed of two intersecting lines of material, which are illustrated to be symmetric in at least one axis. In other implementations, however, the shape of the permanent die support structure 58 may be asymmetric about one or all axes. The locations along the upper or lower planar surfaces of the group of five semiconductor die 60 at which the structure 58 is coupled to the die 60 may be determined by calculations based on, by non-limiting example, individual die size, individual die surface area, individual die shape, localized film properties, localized stress gradients, location(s) of semiconductor devices on/within the die, die thickness, die thickness uniformity, and any other parameter affecting the warpage of an individual semiconductor die. Also, in this implementation of a permanent die support structure 58, the length, orientation, and or position of each of the projections 62, 64, 66, 68 of the structure 58 may be calculated and/or determined using any of the previously mentioned parameters affecting the warpage of a group of die. In FIG. 7, the permanent die support is illustrated with rounded side walls. However, in various implementations, different side wall profiles having straight or substantially straight side walls may be employed. In various implementations, the side wall profile of the permanent die support 58 may also be calculated/determined using any of the previously mentioned parameters that affect the warpage of a group of semiconductor die disclosed in this document. Various implementations of temporary die support structures may also utilize any of the aforementioned permanent die structures.

Various permanent and temporary die support implementations may take the form of a rod/long rectangle with straight or substantially straight side walls. As previously discussed, the profile of the side walls may be changed to assist in reducing the warpage of the group of semiconductor die as can the location of the support and its orientation relative to the perimeter of the die. In various implementations, the rod may not be straight, but may be curved in one or more places to form, by non-limiting example, a C-shape, a U-shape, an S-shape, an N-shape, an M-shape, a W-shape, or any other curved or angled shape formed from one continuous piece of material (see FIG. 6).

In other implementations of permanent or temporary die supports like those disclosed in this document, die support structures with a central portion from which a plurality of ribs project may be utilized. The number, location, and position of the ribs along the central portion may be determined/calculated using any of the previously discussed parameters that affect the warpage of the group of die. The side wall profile of any or all of the ribs and/or the central portion may also be calculated in a similar way using the previously discussed parameters.

Figure 8:
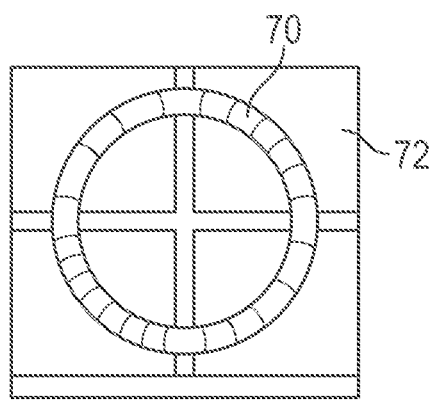
FIG. 8 is a top view of an implementation of an elliptically shaped die support structure coupled to four semiconductor die.

In various implementations, the temporary or permanent die support need not be a shape with straight edges/lines, but, like the implementation of a temporary die support 70 illustrated in FIG. 8, may include an elliptical or spherical shape. In this implementation, the overall three-dimensional shape of the die support 70 is that of a rounded ring as the side wall profile of the material of the ring is rounded. In other implementations, however, the overall three-dimensional shape of the support 70 may be, by non-limiting example, a ring with straight or substantially straight sidewalls, cylindrical with straight side walls, conical with angled side walls, frustoconical with straight side walls and a flat upper surface, or any other three dimensional shape that is formed by projecting an elliptical cross-sectional shape upward from the surface of a group of die 72.

In various implementations of temporary or permanent die supports, various triangular shapes may be utilized. For those supports that are triangular, the shape of the triangle may be acute, right, obtuse, equilateral, isosceles, or scalene in various implementations. As in the previously discussed, the side wall profile of the triangle and the placement of the die support along the largest planar surface of a group of semiconductor die may be determined by any of the previously mentioned parameters that affect the warpage of the group of die.

Figures 9, 10, 11:
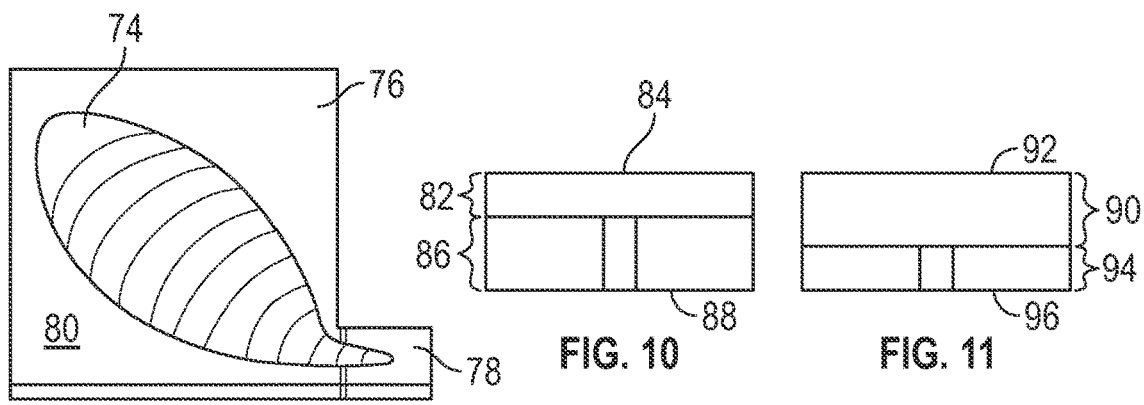
FIG. 9 is a top view of an implementation of an irregularly shaped die support structure coupled to two semiconductor die of different sizes.
FIG. 10 is a side view of an implementation of a die support structure coupled to two semiconductor die where the die support is thinner than the thickness of the two semiconductor die.
FIG. 11 is a side view of an implementation of a die support structure coupled to two semiconductor die where the die support is thicker than the thickness of the two semiconductor die.

Referring to FIG. 9, in various implementation of temporary or permanent die supports the shape of the die support 74 may be irregular as determined by what is calculated to minimize the warpage of a particular configuration of multiple die. In the implementation illustrated, the two die 76, 78 are of different sizes, and so the die support 74 is designed to contact both but in different locations in order to minimize the warpage of the largest planar surface 80 of the group of die. The sidewall profile of the die support 74, like previously discussed, is rounded as determined by what is needed to minimize the warpage of the largest planar surface 80.

In various implementations, the permanent or temporary die support can include more than one portion that is not directly attached to any other portion (see FIG. 5). In various implementations, the specific placement, sizing, and side wall profile of each of the portions may be determined by any of the previously mentioned parameters affecting warpage of a group of die. While in implementation illustrated in FIG. 5, the first portion 40 and second portion 42 are coupled to the largest planar surface 45, in other implementations the different portions may be coupled on/at the thickness of the group of semiconductor die in a manner similar to the implementation illustrated in FIG. 4. In some implementations, first, second, third, and fourth portions may be coupled around each corner of the group of semiconductor die at the thickness of the group. In other implementations, four portions may be included but may be coupled at the thickness at the midpoint of each side of the group of semiconductor die. In various implementations, portions coupled at the thickness may take a variety of other shapes, including, by non-limiting example, semicircular, triangular, square, angled, or any other closed shape. In other implementations, a single permanent or temporary die support structure may be coupled along a side of the group of semiconductor die at the thickness; in others, the single permanent or temporary die support structure may be coupled on a side and may wrap around one or more corners formed by the group of semiconductor die.

Figures 17, 18:
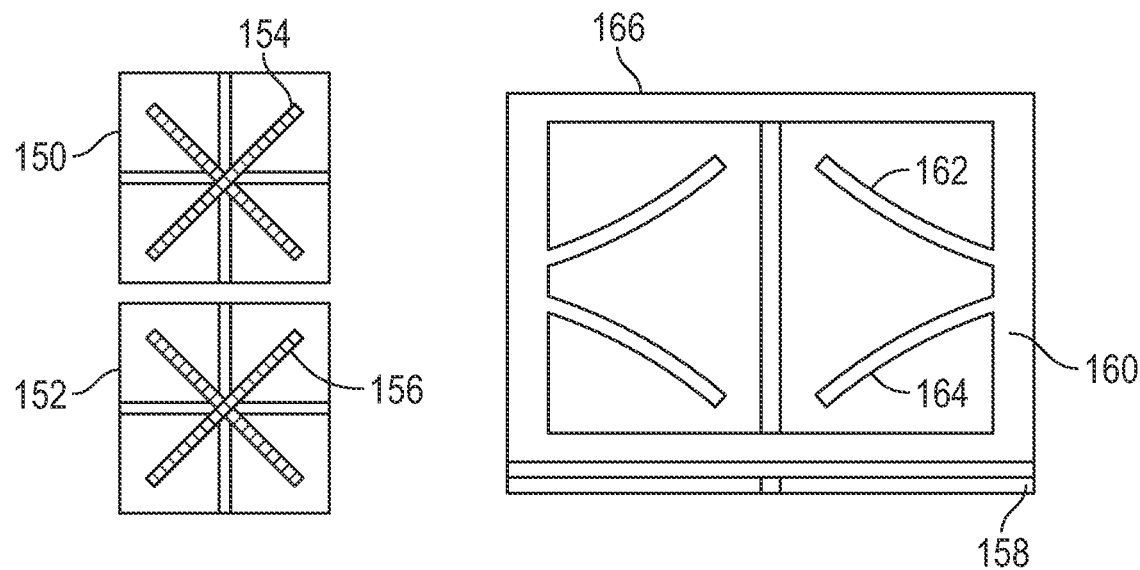
FIG. 17 is a top view of two adjacent groups of 4 die with an X-shaped die support structure applied over each.
FIG. 18 is a top view of a die support comprising multiple curved portions coupled over two semiconductor die.

Referring to FIG. 18, an implementation of a permanent die support 160 is illustrated coupled over two die 158. In this implementation, the die support 160 takes the form of a frame 166 with curved sections 162, 164 extending across the largest planar surface of the two die 158. The radius of curvature of the curved sections 162, 164 may be determined by any of the various parameters that govern warpage disclosed in this document. While the curved sections 162, 164 are illustrated as being symmetrically distributed about the frame 166, in various implementations they may be, by non-limiting example, asymmetric about one or more axes, have different radii of curvature, extend from any side of the frame, include one or more sections, extend nearly across the dimension of the frame, or be placed as determined by any of the parameters that control warpage of groups of die disclosed in this document.

In various implementations of permanent die supports like those disclosed herein, a permanent die support material may fully enclose both of the largest planar surfaces and the thickness of a group of semiconductor die. Whether the die support fully encloses all six sides of the group (in the case of a rectangularly shaped group of die) depends on the desired warpage values. In such implementations where the permanent die support completely covers one or more sides of the group of die, one or more openings may be provided in/formed in the permanent die support through the material of the permanent die support to allow electrical or physical connections with one or more of the group of die. In various other implementations, permanent or temporary die support material may extend over the thickness and one of the two largest planar surfaces of the group of semiconductor die. In such implementations, electrical and physical connections made be formed via the exposed largest planar surface and/or through openings in the material of the die support. A wide variety of possible configurations may be constructed to form electrical and physical connections with a group of semiconductor die to which a permanent or temporary die support like any disclosed in this document using the principles disclosed herein. In various implementations, the permanent die support material may be conformal, or conform to the shape of the die over which the material is coupled. In other implementations, the die support material may be non-conformal forming its own shape rather than assuming part of the shape of the die. In various implementations, the permanent die support material may be applied as a coating to the semiconductor die.

Referring to FIG. 10, in various implementations, a thickness 82 of the die support material 84 may be thinner than a thickness 86 of the group of die 88. In other implementations, as illustrated in FIG. 11, a thickness 90 of the die support material 92 may be thicker than a thickness 94 of the group of die 96. The particular thickness and uniformity of the thickness of the die support material over the surfaces of the group of die may be determined using any of the factors influencing the warpage of a group of die disclosed herein.

The various implementations of permanent and temporary die support structures disclosed herein may be formed using various methods of forming a die support structure. In a particular method implementation, the method includes permanently or temporarily coupling a material with a two or more semiconductor die. This material may be a mold compound or any other material disclosed in this document used to form a permanent die support structure. This material may also be any material disclosed in this document used to form a temporary die support structure. The group of semiconductor die may be any type disclosed herein that includes two largest planar surfaces with a thickness between the surfaces and the thickness may be any thickness disclosed in this document. The semiconductor device(s) included on the group of semiconductor die may be any disclosed in this document. At the time where the material is permanently or temporarily coupled with the group of semiconductor die, the material may be coupled with any, all, or any combination of a first largest planar surface, a second largest planar surface, or the thickness. The method includes reducing a warpage of a largest planar surface of the group of semiconductor die to less than 50 microns through the coupling the material. In particular implementations the method may include reducing a warpage of a largest planar surface of the group of semiconductor die to less than 25 microns.

As disclosed in this document, in various method implementations, the method includes permanently or temporarily coupling (or temporarily and permanently coupling in some implementations) two or more portions of material to the group of semiconductor die to one, all, or any combination of the first largest planar surface, the second largest planar surface, or the thickness. In various method implementations, the method may include permanently or temporarily coupling a second layer of material over the material originally permanently coupled with the semiconductor die. Additional layers beyond the second layer may also be coupled over the second layer in various method implementations.

In various method implementations, the point in a group of semiconductor die's processing where the permanent die support structure is coupled may vary from implementation to implementation. In some method implementations, the point at where the permanent die support structure is applied may occur before or after the group of semiconductor die has been physically singulated from among the plurality of semiconductor die being formed on a semiconductor substrate. Similarly, in various method implementations, the point in processing where a temporary die support structure is coupled may vary from implementation to implementation. In some implementations the temporary die support may be attached prior to attachment of the group of die to a substrate or other attachment structure, at which point the temporary die support is removed.

Figure 12:
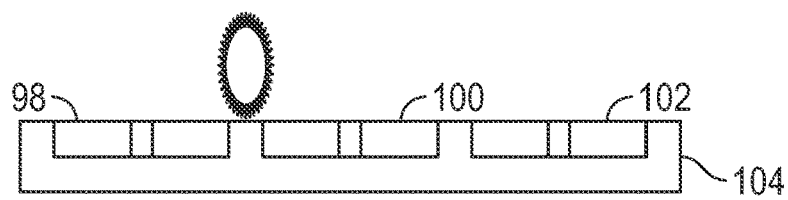
FIG. 12 is a side view of an implementation of a permanent die support structure formed of a mold compound coupled to multiple groups of two semiconductor die during a singulation process.

Referring to FIG. 12, an implementation of three groups of semiconductor die 98, 100, 102 are illustrated coupled together in a permanent die support 104 which is composed of a mold compound. In this implementation, the three groups 98, 100, 102 were molded into the permanent die support 104 at the same time. Following formation of the permanent die support 104, the groups 98, 100, 102 are singulated from each other using any of a wide variety of process, including, by non-limiting example, sawing (illustrated), lasering, jet ablating, etching, plasma etching, and any other singulating method. Following singulation the groups 98, 100, 102 are then used in subsequent die packaging operations.

Figure 13:
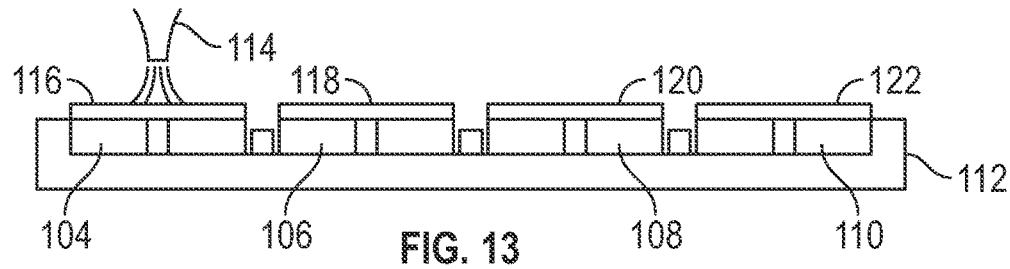
FIG. 13 is a side view of a plurality of die support structures being applied to a plurality of groups of two semiconductor die using a jig.

Referring to FIG. 13, four groups of semiconductor die 104, 106, 108, 110 are illustrated placed into a jig/mold/guide 112 which is designed to retain the groups in a place. As illustrated, a dispensing process 114 is being used to apply a temporary die support structure 116, 118, 120, 122 over each of the groups. Following the dispensing, the groups 104, 106, 108, 110 are then removed from the jig 112 and used in subsequent die packaging operations. The various implementations, the jig/mold/guide 112 may include various vacuum/air pressure ports/openings designed to hold the groups in a desired location and/or retain the groups in a desired warpage value until the temporary die support has been applied/formed. Various curing steps may also be carried out to cure/harden the material of the temporary die supports 116, 118, 120, 122 while the groups are retained in the jig 112.

Figure 14:
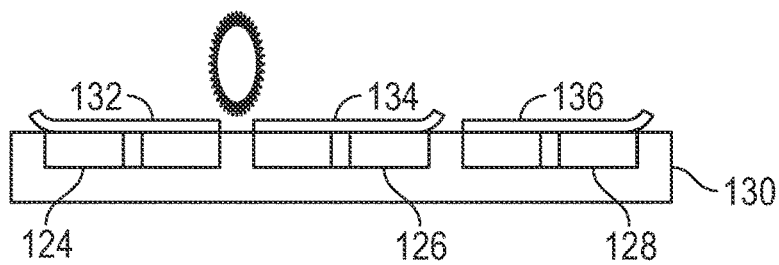
FIG. 14 is a side view of the plurality of groups of two semiconductor die of FIG. 13 after coupling with a permanent die support structure showing removal of a temporary die support prior to a singulation process.

Referring to FIG. 14, three groups of semiconductor die 124, 126, 128 are illustrated after molding into a permanent die support 130 while being supported by temporary die supports 132, 134, 136. As illustrated, the temporary die supports 132, 134, 136 are now being peeled from the surface of each of the three groups 132, 134, 136 in preparation for a singulation process (in this case, sawing) like any disclosed in this document.

In various method implementations, the temporary or permanent die supports may be coupled prior to or after probing of the individual die/groups of die. Similarly, the temporary or permanent die supports may be applied to a plurality of die on a semiconductor substrate prior to or after probing the plurality of die/groups of die.

Figure 15:
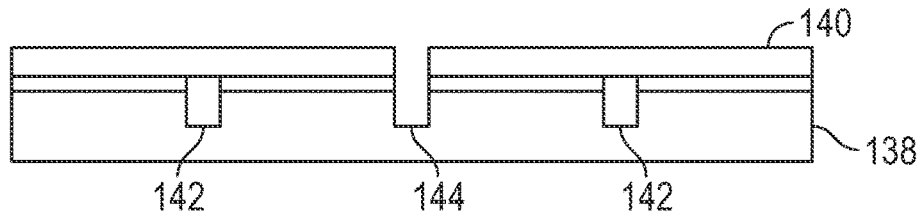
FIG. 15 is a side view of a thinned semiconductor substrate showing a die support structure coupled over two groups of two semiconductor die showing a plurality of die streets.

In various method implementations, no precut or partial grooving between the plurality of die of a semiconductor substrate (or groups of die) may be carried out. Where the plurality of die (or groups of die) will be thinned, the depth of the die/saw streets/scribe lines may be sufficient to carry out the various methods of forming semiconductor packages disclosed herein. For example, and with reference to FIG. 15, where the semiconductor substrate 138 will be thinned to about 10 microns, the about 5 micron depth of the die streets 142 into the material of the substrate/die resulting from the processing steps that form the groups of semiconductor die suffices to act as the equivalent of any partial grooving/precutting. In various implementations, as illustrated in FIG. 15, permanent or temporary die support structures 140 may be applied over the groups of die leaving specific die streets 144 exposed for subsequent processing.

In particular method implementations, the depth of the exposed die streets 144 can be increased during the die fabrication process. In other particular method implementations, the depth of the exposed die streets may be increased during die preparation/packaging processes following die fabrication. In this way, any separate precut or partial grooving of the wafer using a saw or other process may be rendered unnecessary. Avoiding separately precutting/partial grooving may facilitate the sawing process and/or eliminate risk of sidewall cracking due to coefficient of thermal expansion (CTE) mismatches. While using the depth of the die streets to set sidewall coverage of mold compound rather than the depth of a precut into the semiconductor substrate may reduce the partial sidewall coverage for each group of die, the benefits may outweigh the additional coverage in various method implementations.

In various method implementations, temporary or permanent die support structures may be coupled to the plurality of die while the semiconductor substrate while it is at full thickness, or, in other words, prior to any thinning operations being performed. Additional thinning operations can then be initiated with the temporary or permanent die support structures in place. Also, for those processes where precut/grooving operations take place prior to thinning, these steps can take place after coupling of the temporary or permanent die support structures.

In various method implementations, temporary or permanent die support structures may be coupled over groups of die after thinning is performed. In other implementations, the temporary or permanent die support structures may be applied over the groups of die after backmetal layer(s) have been applied to the semiconductor substrate. In yet other method implementations, the temporary or permanent die support structures may be applied over the groups of die after the semiconductor substrate has been only partially thinned, such as, by non-limiting example, through removing backside oxide prior to probing, an initial grinding step prior to a polishing/lapping step, or any other process which partially removes a layer of material or bulk material from the side of the semiconductor substrate opposite the die.

In various method implementations, the temporary or permanent die support structures may be applied over the groups of semiconductor die after a full backgrinding process is carried out but prior to or after a stress relief wet etching process has been carried out. In such implementations, the stress relief wet etching may be carried out with or without backmetal. In some implementations, the stress relief wet etching may take place after protecting the front side (die side) of the semiconductor substrate. The stress relief etching may reduce the backside damage to the semiconductor substrate that is caused by the backgrinding process. The use of the stress relief etching may also facilitate adhesion of the backmetal applied to the ground surface. In various implementations, the application of the temporary or permanent die support structures may be carried out prior to a backmetal formation process. A wide variety of sequences of method steps involving coupling of temporary or permanent die support structures may be carried out using the principles disclosed in this document for packaging process involving wafer scale operations like those disclosed in this document used for semiconductor substrates.

Figure 16:
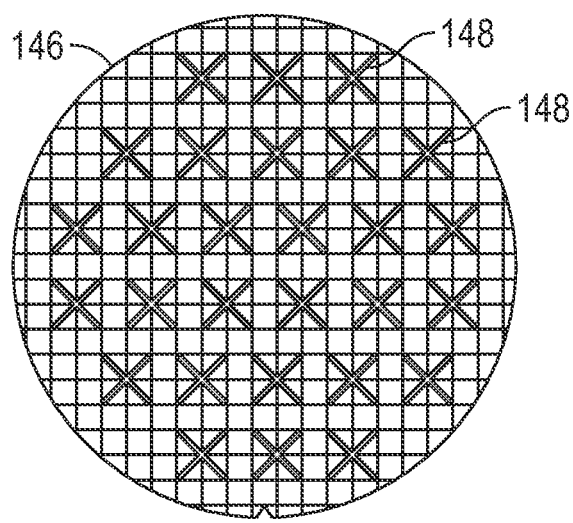
FIG. 16 is a top view of a semiconductor substrate with a plurality of die with a plurality of X-shaped die support structures applied over adjacent groups of 4 die.

Referring to FIG. 16, temporary or permanent die support structures 148 may be applied to a thinned semiconductor substrate 146 prior to singulation of the various groups of die. In other implementations, temporary or permanent die support structures may be coupled with the groups of thinned die after singulation but before picking of the groups of die while the thinned groups of die are still supported on dicing tape. A wide variety of potential options may exist for the timing of when the temporary or permanent support structures may be applied to the die during wafer scale packaging operations.

Similarly to the timing of applying temporary or permanent die support structures during methods of wafer scale packaging groups of die, the timing may vary in various implementations of chip scale packaging groups of die. For example, referring to FIG. 17, a temporary or a permanent die support structure 154, 156 may be applied individually to groups of die 150, 152. Temporary or permanent dies supports may be applied as the first step following die picking from a singulation tape, or immediately following die singulation prior to picking. In other method implementations, a temporary or permanent die support structure may be applied at or just prior to a later step in the process, such as, by non-limiting example, die attach, die underfilling, flux washing, epoxy cure, prior to a full encapsulating step, after lead frame attach, or any other chip scale packaging process operation. In various implementations, temporary die supports may generally be applied prior to die attach, as after die attach there may be no further need for the temporary die support. A wide variety of sequences of method steps involving coupling a temporary or permanent die support structures may be employed in various method implementations using the principles disclosed in this document.

A wide variety of methods and processes may be employed to remove the temporary die supports from groups of die at the point in the process where the temporary supports are no longer needed. Various implementations of a temporary die supports may be peeled off of the surface of groups of die after or during exposure from a light source. This light source may be, by non-limiting example, a visible light source, an infrared light source, an ultraviolet light source, a laser light source, or any other source of light capable of acting to release or assist in releasing the temporary die support. For example, if the temporary die support was a UV release tape, then the support could be peeled from the surface of the group of thinned die following exposure to a UV light source for a predetermined period of time after the group of thinned die had been attached to, by non-limiting example, a substrate, leadframe, another die, a lead, a redistribution layer, any combination thereof, or any other die bonding structure.

In various implementations, temporary die supports may be etched from a group of die using a plasma etching source. While a plasma etching source may be used, any other etching process could be employed in various implementations, including, by non-limiting example, a wet etching process, a spray etching process, a reactive ion etching process, an ion bombardment process, a lasering process, a grinding process, or any other process capable of reacting away or ablating the material of the temporary die support.

In other implementations, the temporary die support may be removed using energy assisting processes. In various implementations, a temporary die support may be separated from a group of thinned die in a bath under ultrasonic energy produced by ultrasonic energy source. Under the influence of the compression waves in the fluid of the bath, the temporary die support may separate without requiring any pulling force, or the peeling of the temporary die support may be enabled by the ultrasonic energy. While the use of a bath 238 is illustrated, in various implementations a puddle may be used. In still other implementations, the ultrasonic energy may be directly or indirectly applied to the group of die through a spindle, a chuck, a plate, or a liquid stream. In various implementations, the source of sonic energy may range from about 20 kHz to about 3 GHz. Where the sonic frequencies utilized by the ultrasonic energy source are above 360 kHz, the energy source may also be referred to as a megasonic energy source. In particular implementations, the sonic energy source may generate ultrasonic vibrations at a frequency of 40 kHz at a power of 80 W. In various implementations, the sonic energy source may apply a frequency of between about 30 kHz to about 50 kHz or about 35 kHz to about 45 kHz. However, in various implementations, frequencies higher than 50 kHz may be employed, including megasonic frequencies. A wide variety of power levels may also be employed in various implementations.

In various semiconductor package and method implementations disclosed in this document, any of the pads or electrical connectors disclosed in this document may be formed, by any or any combination of the following: evaporation, sputtering, soldering together, screen printing, solder screen printing, silver sintering one or more layers of materials. Any of the foregoing may also be used in combination with electroplating or electroless plating methods of forming pads and/or electrical connectors.

In places where the description above refers to particular implementations of die support structures and implementing components, sub-components, methods and sub-methods, it should be readily apparent that a number of modifications may be made without departing from the spirit thereof and that these implementations, implementing components, sub-components, methods and sub-methods may be applied to other die support structures.

What is claimed is:

1. A semiconductor device comprising:
   a first largest planar surface, a second largest planar surface and a thickness between the first largest planar surface and the second largest planar surface; and
   a die support structure coupled to one of the first largest planar surface or the second largest planar surface;
   wherein the semiconductor device has been singulated from a wafer;
   wherein the first largest planar surface, the second largest planar surface, and the thickness are formed by at least two semiconductor die;
   wherein the die support structure extends around a perimeter of one of the first largest planar surface or the second largest planar surface; and
   wherein one of the first largest planar surface or the second largest planar surface is exposed through an opening in the die support structure.

2. The semiconductor device of claim 1, wherein a warpage of one of the first largest planar surface or the second largest planar surface is less than 200 microns.

3. The semiconductor device of claim 1, wherein the die support structure comprises one of a permanent die support structure, a temporary die support structure, or any combination thereof.

4. The semiconductor device of claim 1, wherein the thickness is between 0.1 microns and 125 microns.

5. The semiconductor device of claim 1, wherein the die support structure comprises a perimeter comprising a closed shape.

6. The semiconductor device of claim 1, wherein the die support structure comprises a first U-shaped portion and a second U-shaped portion, wherein a gap breaks a perimeter of the die support structure and separates the first U-shaped portion from the second U-shaped portion.

7. The semiconductor device of claim 1, wherein a perimeter of at least two semiconductor die is rectangular and a size of the at least two semiconductor die is at least 6 mm by 6 mm.

8. The semiconductor device of claim 1, wherein the die support structure comprises two or more layers.

9. A semiconductor device comprising:
   a first largest planar surface, a second largest planar surface and a thickness between the first largest planar surface and the second largest planar surface; and
   a die support structure coupled to one of the first largest planar surface or the second largest planar surface;
   wherein the semiconductor device has been singulated from a wafer;
   wherein the first largest planar surface, the second largest planar surface, and the thickness are formed by at least two semiconductor die; and
   wherein an outer edge of the die support structure is set in from an outer edge of one of the first largest planar surface or the second largest planar surface.

10. The semiconductor device of claim 9, wherein a warpage of one of the first largest planar surface or the second largest planar surface is less than 200 microns.

11. The semiconductor device of claim 9, wherein the die support structure comprises a temporary die support structure.

12. The semiconductor device of claim 1, wherein the first largest planar surface, the second largest planar surface, and a thickness between the first largest planar surface and the second largest planar surface is comprised of more than two die.

13. The semiconductor device of claim 1, wherein an outer perimeter of the more than two die form a non-rectangular shape.

14. The semiconductor device of claim 9, wherein a perimeter of the die support structure comprises an L-shape.

15. The semiconductor device of claim 9, wherein a perimeter of the die support structure comprises a circular shape comprising an opening therethrough.

16. A semiconductor device comprising:
   a first largest planar surface, a second largest planar surface and a thickness between the first largest planar surface and the second largest planar surface; and
   a die support structure coupled to one of the first largest planar surface or the second largest planar surface;
   wherein the semiconductor device has been singulated from a wafer;
   wherein the first largest planar surface, the second largest planar surface, and the thickness are formed by at least two semiconductor die; and
   wherein the die support structure comprises two intersecting portions.

17. The semiconductor device of claim 16, wherein the die support structure comprises a permanent die support structure.

18. The semiconductor device of claim 16, wherein the first largest planar surface, the second largest planar surface, and a thickness between the first largest planar surface and the second largest planar surface is comprised of four or more die.

19. The semiconductor device of claim 16, wherein an outer perimeter of the die support structure comprises an X-shape.

20. The semiconductor device of claim 16, wherein each end of the die support structure is directly coupled to a die.

* * * * *